United States Patent [19]

Yonaga

[11] Patent Number: 5,790,470
[45] Date of Patent: Aug. 4, 1998

[54] DECODER CIRCUIT HAVING A PREDECODER ACITIVATED BY A RESET SIGNAL

[75] Inventor: Takeru Yonaga, Tokyo, Japan

[73] Assignee: Oki Electric Industry Co., Ltd., Tokyo, Japan

[21] Appl. No.: 785,601

[22] Filed: Jan. 17, 1997

[30] Foreign Application Priority Data

Sep. 27, 1996 [JP] Japan .................................. 8-256551

[51] Int. Cl.$^6$ ................................................ G11C 13/00
[52] U.S. Cl. ........................ 365/230.06; 365/189.05; 365/230.08
[58] Field of Search ..................... 365/189.01, 189.05, 365/230.06, 230.08

[56] References Cited

U.S. PATENT DOCUMENTS 5,148,397  9/1992  Kokbun .......................... 365/189.01

Primary Examiner—Terrell W. Fears
Attorney, Agent, or Firm—Wenderoth, Lind & Ponack

[57] ABSTRACT

A decoder circuit prevented from multi-selection is disclosed. The decoder circuit has a pulse generator receiving an external clock signal and outputting a reset signal in response to the external clock signal, address counters receiving the external clock signal and outputting address count signals and address buffers coupled to the address counters respectively. Each of the address buffers receives an external address signal and the address count signal and outputs an internal address signal. The decoder circuit further has address predecoders coupled to the pulse generator and said address buffers. Each of the address predecoders decodes the internal address signals to output a predecode signal in response to the reset signal. The decoder circuit further has an address decoder coupled to the address predecoders. The address decoder decodes the predecode signals to output decode signals.

32 Claims, 6 Drawing Sheets ns device,
having a prede-
al suitable for use in a synchronous semiconductor memory device.

DECODER CIRCUIT HAVING A PREDECODER ACTIVATED BY A RESET SIGNAL

BACKGROUND OF THE INVENTION

This invention relates to a semiconductor memory device, and more specifically to a decoder circuit having a predecoder activated by a reset signal suitable for use in a synchronous semiconductor memory device.

A conventional DRAM has Y address counters each inputted with an external synchronization input signal (CLK) and Y address buffers respectively supplied or inputted with address count signals outputted from the Y address counters and external input addresses to thereby output internal Y address signals therefrom. The internal Y address signals outputted from the Y address buffers are inputted to their corresponding Y address predecoders. The Y address predecoders output predecode signals to a Y address decoder.

However, the conventional example referred to above has the problem that a skews are produced between the respective internal Y addresses and decode signals are multi-selected. Namely, the Y address counters and the Y address buffers are respectively independent of one another. Further, the values of resistance of output signal lines for the respective circuits and the values of capacitance thereof are respectively different from one another. Therefore, the skew is produced between the respective internal Y addresses. The skew will cause displacements of timing provided to activate the predecode signals, thus resulting in a decode signal to be originally selected; and other decode signals being simultaneously multi-selected. As an example in which the multi-selection takes place, a phenomenon occurs in which data temporarily written into a normal address upon write operation is rewritten into another due to the occurrence of data multi-selection.

SUMMARY OF THE INVENTION

With the foregoing in view, it is an object of the present invention to provide a decoder circuit having a pulse generator circuit for outputting a control signal, based on an external clock signal. Decode means are controlled so that the internal address signals are decoded only when the control signal is at a predetermined level.

According to one aspect of the present invention, for achieving the above object, there is provided, as a specific configuration, a decoder circuit comprising a pulse generator receiving an external clock signal and outputting a reset signal in response to the external clock signal, address counters receiving the external clock signal and outputting address count signals and address buffers coupled to the address counters respectively. Each of the address buffers receives an external address signal and the address count signal and outputs an internal address signal. The decoder circuit further comprising address predecoders coupled to the pulse generator and said address buffers. Each of the address predecoders decodes the internal address signals to output a predecode signal in response to the reset signal. The decoder circuit further comprising an address decoder coupled to the address predecoders. The address decoder decodes the predecode signals to output decode signals.

The present application discloses other various inventions made to achieve the above-described object. These inventions will be understood from the appended claims, the following embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
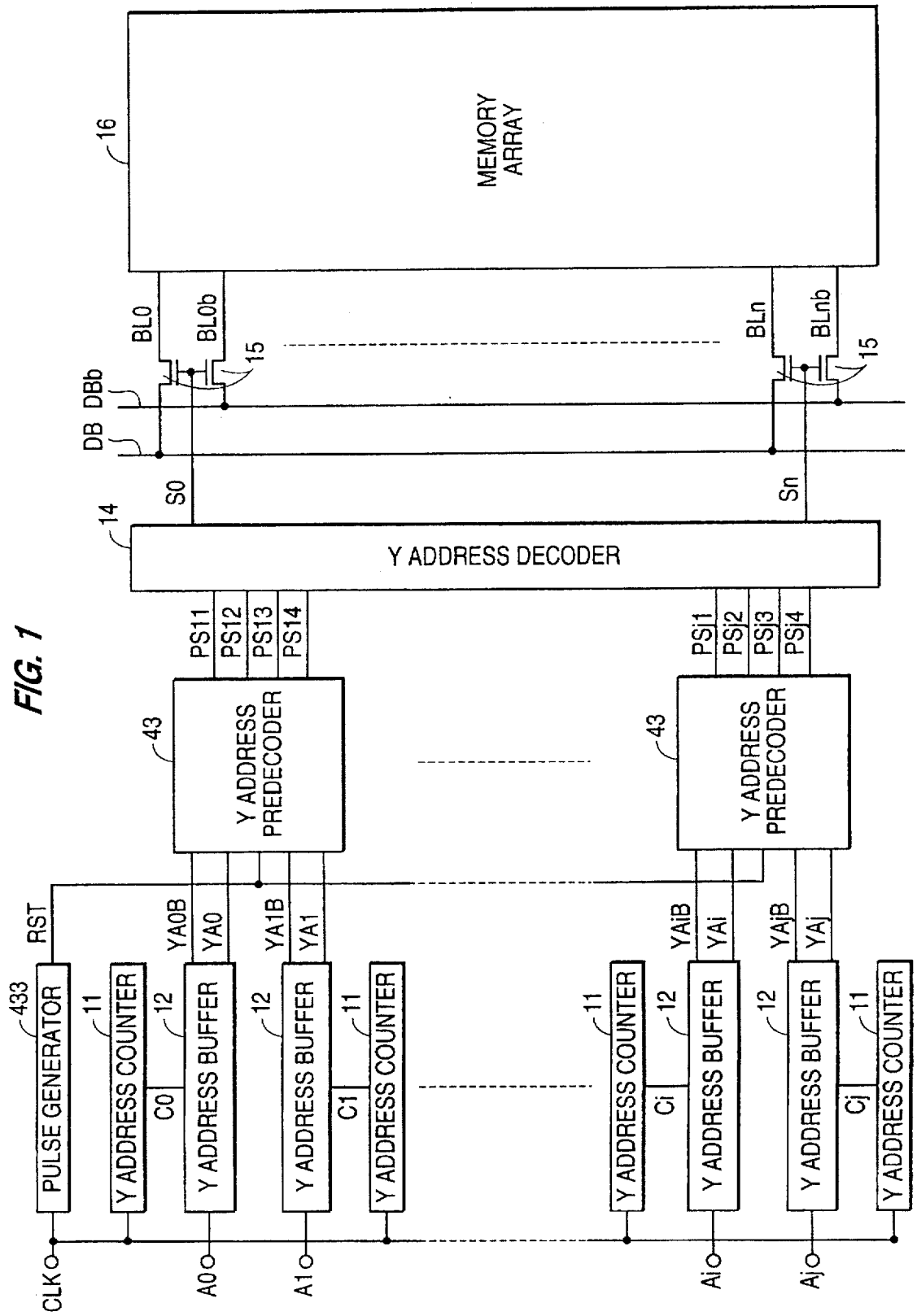
FIG. 1 is a block diagram showing a configuration of a Y address decoder circuit illustrative of a first embodiment of the present invention.

FIG. 1 shows one example of a configuration of a Y address decoder circuit of a synchronous DRAM which illustrates a first embodiment of the present invention. The present DRAM has a plurality of Y address counters 11 supplied with an external synchronization input signal (an external clock signal) CLK, a plurality of Y address buffers 12 respectively supplied with address count signals C0 through Cj outputted from the Y address counters 11 and a plurality of external input addresses A0 through Aj, and a pulse generator 433 supplied with the external synchronization input signal CLK.

Further, the DRAM includes a plurality of Y address predecoders 43 respectively supplied with internal address signals YA0 through YAj outputted from the Y address buffers 12 and a reset signal RST outputted from the pulse generator 433, and a Y address decoder circuit 14 supplied with predecode signals PS11 through PSj4 respectively outputted from the Y address predecoders 43. The Y address decoder 14 is electrically connected to a memory array 16 composed of sense amplifiers and memory cells connected to bit lines BL/BLb, through a plurality of NMOS transistors 15 whose gates are supplied with decode signals S0 through Sn outputted from the Y address decoder 14, whose sources are electrically connected to data buses DB/DBb and whose drains are electrically connected to the bit lines BL/BLb.

Figure 2:
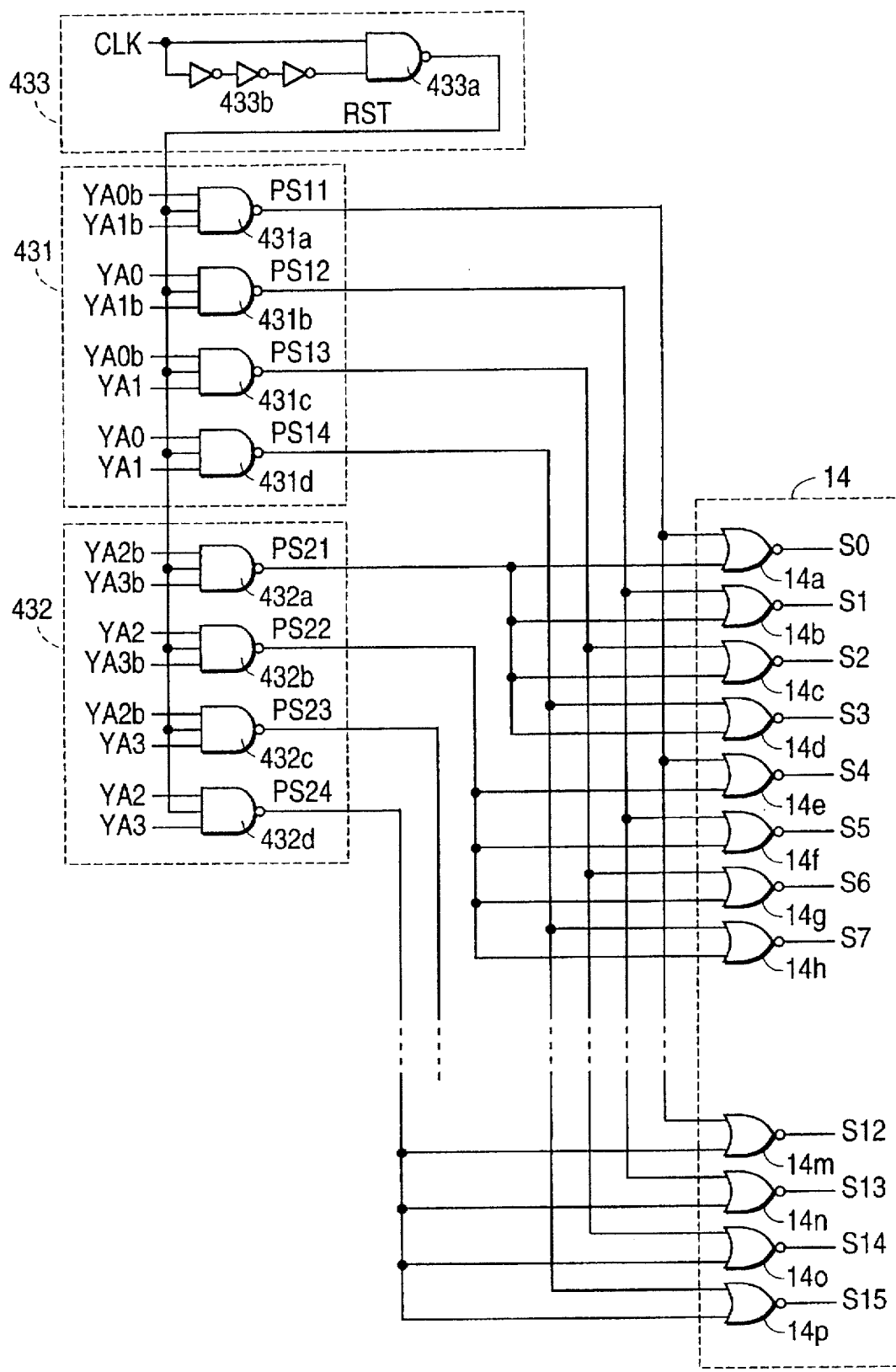
FIG. 2 is a circuit diagram illustrating a Y address decoder according to the first embodiment of the present invention.

FIG. 2 is a circuit diagram showing the Y address predecoders 43, the pulse generator 433 and the Y address decoder 14 shown in FIG. 1. Incidentally, the Y address predecoders 43 shown in FIG. 1 will be described by being divided into a first Y address predecoder 431 and a second Y address predecoder 432.

The pulse generator 433 comprises a two-input NAND circuit (NAND gate) 433a and a row of three inverters 433b. The external synchronization input signal CLK is inputted to the input of the inverter row 433b. One input of the two-input NAND circuit 433a is supplied with the external synchronization input signal CLK, whereas the other input thereof is electrically connected to the output of the inverter row 433b. Further, the pulse generator 433 outputs a reset signal RST therefrom.

The first Y address predecoder 431 comprises four three-input NAND circuits 431a, 431b, 431c and 431d. The three-input NAND circuit 431a is supplied with a negative logic signal YA0b corresponding to an internal Y address, a negative logic signal YA1b corresponding to an internal Y address and the reset signal RST and outputs a predecode signal PS11 therefrom. The three-input NAND circuit 431b is supplied with a positive logic signal YA0 corresponding to an internal Y address, the negative logic signal YA1b and the reset signal, RST and outputs a predecode signal PS12 therefrom. The three-input NAND circuit 431c is supplied with the negative logic signal YA0b, a positive logic signal YA1 corresponding to an internal Y address and the reset signal RST and outputs a predecode signal PS13 therefrom. The three-input NAND circuit 431d is supplied with the positive logic signal YA0, the positive logic signal YA1 and the reset signal RST and outputs a predecode signal PS14 therefrom.

The second Y address predecoder 432 comprises four three-input NAND circuits 432a, 432b, 432c and 432d. The three-input NAND circuit 432a is supplied with a negative logic signal YA2b for an internal Y address, a negative logic signal YA3b for the internal Y address and the reset signal RST and outputs a predecode signal PS21 therefrom. The three-input NAND circuit 432b is supplied with a positive logic signal YA2 corresponding to an internal Y address, the negative logic signal YA3b and the reset signal RST and outputs a predecode signal PS22 therefrom. The three-input NAND circuit 432c is supplied with the negative logic signal YA2b, a positive logic signal YA3 corresponding to an internal Y address and the reset signal RST and outputs a predecode signal PS23 therefrom. The three-input NAND circuit 432d is supplied with the positive logic signal YA2, the positive logic signal YA3 and the reset signal RST and outputs a predecode signal PS24 therefrom.

The Y address decoder circuit 14 comprises a plurality of two-input NOR circuits 14a through 14p. The predecode signal PS11 is inputted to one input of the two-input NOR circuit 14a. The predecode signal PS21 is inputted to the other input of the two-input NOR circuit 14a so that a decode signal S0 is outputted from the two-input NOR circuit 14a. The predecode signal PS12 is inputted to one input of the two-input NOR circuit 14b. The predecode signal PS21 is inputted to the other input of the two-input NOR circuit 14b so that a decode signal S1 is outputted from the two-input NOR circuit 14b. The predecode signal PS13 is inputted to one input of the twoinput NOR circuit 14c. The predecode signal PS21 is inputted to the other input of the two-input NOR circuit 14c so that a decode signal S2 is outputted from the two-input NOR circuit 14c. The predecode signal PS14 is inputted to one input of the two-input NOR circuit 14d. The predecode signal PS21 is input to the other input of the two-input NOR circuit 14d so that a decode signal S3 is outputted from the two-input NOR circuit 14d.

In a manner similar to the above, one inputs of the two-input NOR circuits 14e through 14p are subsequently inputted with the predecode signals PS11, PS12, PS13 and PS14 in turn. The other inputs thereof are successively supplied with the predecode signals PS22, PS23 and PS24 every four circuits to output decode signals S4 through S15.

Figure 3:
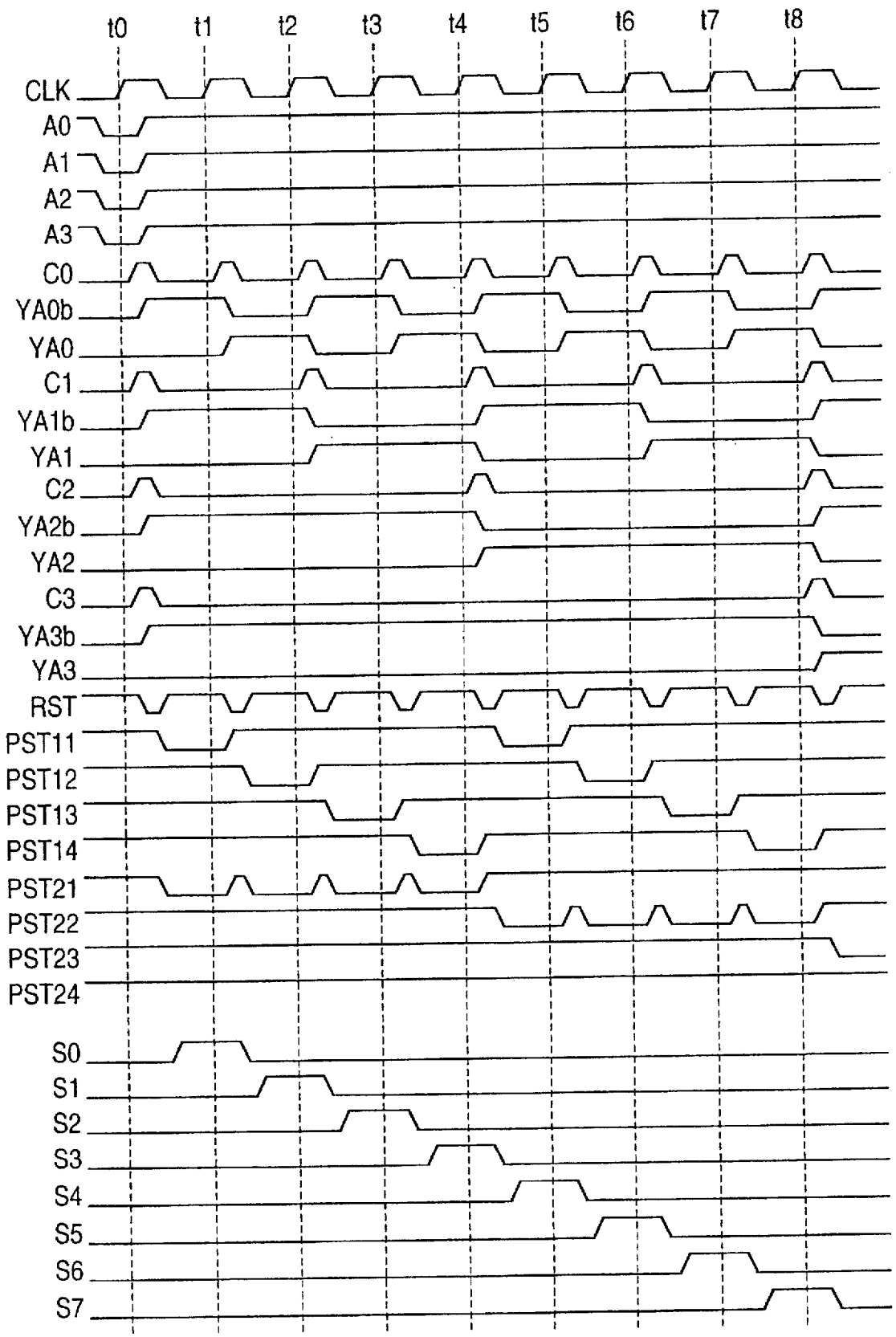
FIG. 3 is a timing chart for describing operating waveforms employed in the first embodiment.

FIG. 3 is a timing chart for describing operating waveforms employed in the first embodiment.

Now first consider that in advance, respective internal address signals and address count signals have been set to a ground potential (hereinafter called "low level"), respective predecode signals and a reset signal have been set to a source potential (hereinafter called "high level"), and respective decode signals have been set to the low level. A description will now be made of an example in which low-level external input addresses are input at a time t0.

At the time t0, the internal Y address signals are activated and the address count signals C0, C1, C2 and C3 corresponding to pulse signals each having an increment function are activated. The internal Y addresses YA0b, YA1b, YA2b and YA3b change from the low to high levels according to the address count signals C0, C1, C2 and C3. When the reset signal RST corresponding to a pulse, which is controlled based on the external synchronization input signal CLK, now changes from the high to low levels, the predecode signals PS11 and PS21 remain at the high level during that low-level period. Thereafter, when the reset signal RST changes from the low to high levels, each of the predecode signals PS11 and PS21 makes a high-level to low-level transition. As a result, the decode signal S0 changes from the low to high levels.

When the address count signal C0 is activated at a time t1, the internal Y address YA0b changes from the high to low levels and the internal Y address YA0 makes a low-level to high-level transition. When the reset signal RST now reaches the low level from the high level, the predecode signals PS11 and PS21 respectively change from the low to high levels and the decode signal S0 changes from the high to low levels. Thereafter, when the reset signal RST changes from the low to high levels, each of the predecode signals PS12 and PS21 makes a high-level to low-level transition. As a result, the decode signal S1 changes from the low to high levels.

When the address count signals C0 and C1 are activated at a time t2, the internal Y addresses YA0, YA1b change from the high to low levels and the internal Y addresses YA0b and YA1 change from the low to high levels. When the reset signal RST makes a high-level to low-level transition, each of the predecode signals PS12 and PS21 changes from the low to high levels and the decode signal S1 changes from the high to low levels. When the reset signal RST reaches the high level from the low level, the predecode signal PS13 makes a high-level to low-level transition. As a result, the decode signal S2 changes from the low to high levels.

When the address count signal C0 is activated at a time t3, the internal Y address YA0b changes from the high to low levels and the internal Y address YA0 changes from the low to high levels. If the reset signal RST changes from the high to low levels, then each of the predecode signals PS13 and PS21 makes a low-level to high-level transition and the decode signal S2 makes a high-level to low-level transition. When the reset signal RST changes from the low to high levels, the predecode signal PS14 makes a high-level to low-level transition. As a result, the decode signal S3 changes from the low to high levels.

When the address count signals C0, C1 and C2 are activated at a time t4, each of the internal Y addresses YA0, YA1 and YA2b changes from the high to low levels and each of the internal Y addresses YA0b, YA1b and YA2 makes a low-level to high-level transition. When the reset signal RST changes from the high to low levels, each of the predecode signals PS14 and PS21 changes from the low to high levels and the decode signal S3 changes from the high to low levels. Further, when the reset signal RST reaches the high level from the low level, each of the predecode signals PS11 and PS22 changes from the high to low levels. As a result, the decode signal S4 changes from the low to high levels.

The same operations as described above are subsequently repeated. As a result, sequentially produced decode signals each synchronized with the external synchronization input signal CLK and having a non-select period are selected. Although not shown in FIG. 3, the corresponding NMOS transistor 15 shown in FIG. 1 is thereafter turned ON in response to each selected decode signal to provide electrical connections between the bit line pair BL/BLb and the data buses DB/DBb, whereby a write or read operation is performed.

According to the first embodiment, as has been described above, since the reset signal RST generated based on the external synchronization input signal CLK is used, the timing provided to activate each predecode signal depends on the reset signal RST alone without depending on the skew produced between the internal Y addresses. It is therefore possible to prevent the decode signals from being multi-selected. Since the external synchronization input signal CLK is used as the signal to be input to the pulse generator, the synchronous DRAM can be easily controlled. Further, since the reset signal RST is input commonly to the individual predecoders, an advantageous effect can be brought about in that the respective predecoders can be made identical in configuration to each other and the plurality of predecoders can be centralizedly controlled.

Figure 4:
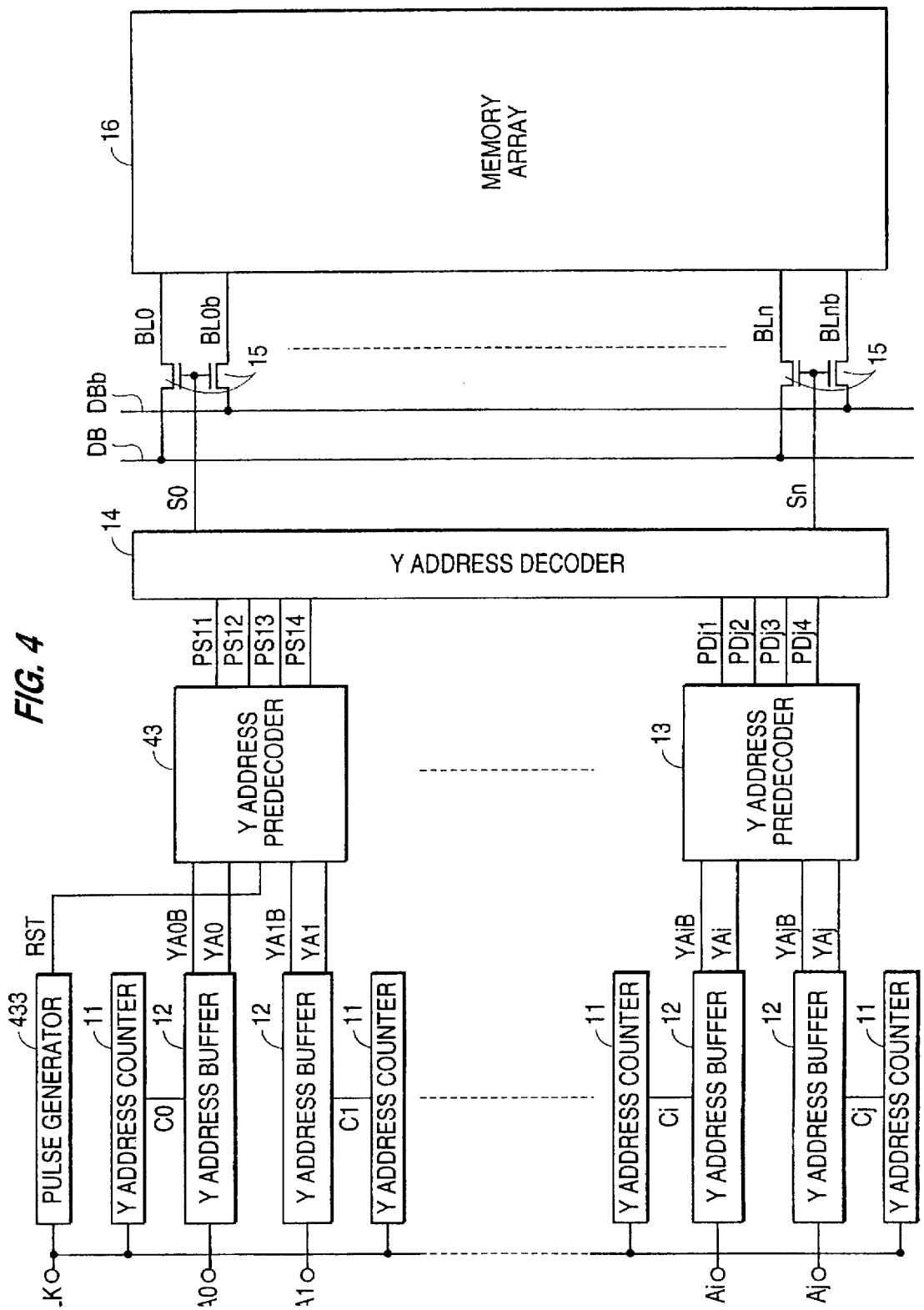
FIG. 4 is a block diagram showing a configuration of a Y address decoder circuit illustrative of a second embodiment of the present invention.

FIG. 4 shows one example of a configuration of a Y address decoder circuit of a synchronous DRAM illustrative of a second embodiment of the present invention. In a manner similar to the first embodiment, the DRAM according to the second embodiment comprises a plurality of Y address counters 11 supplied with an external synchronization input signal CLK, a plurality of Y address buffers 12 supplied with address count signals C0 through Cj respectively outputted from the Y address counters 11 and a plurality of external input addresses A0 through Aj, and a pulse generator 433 supplied with the external synchronization input signal CLK.

Further, the DRAM includes Y address predecoders 43 supplied with internal Y address signals YA0 and YA0b outputted from the Y address buffers 12 and a reset signal RST outputted from the pulse generator 433, a plurality of Y address predecoders 13 supplied with internal Y address signals YA1 through YAjb outputted from the Y address buffers 12, and a Y address decoder circuit 14 supplied with predecode signals PS11 through PSj4 respectively outputted from the Y address predecoders 43 and the Y address predecoders 13. The Y address decoder 14 is electrically connected to a memory array 16 composed of sense amplifier circuits and memory cells connected to bit lines BL/BLb, through a plurality of NMOS transistors 15. The gates of the NMOS transistors 15 are supplied with decode signals S0 through Sn outputted from the Y address decoder circuit 14. The sources thereof are electrically connected to data buses DB/DBb. The drains thereof are electrically connected to the bit lines BL/BLb.

Figure 5:
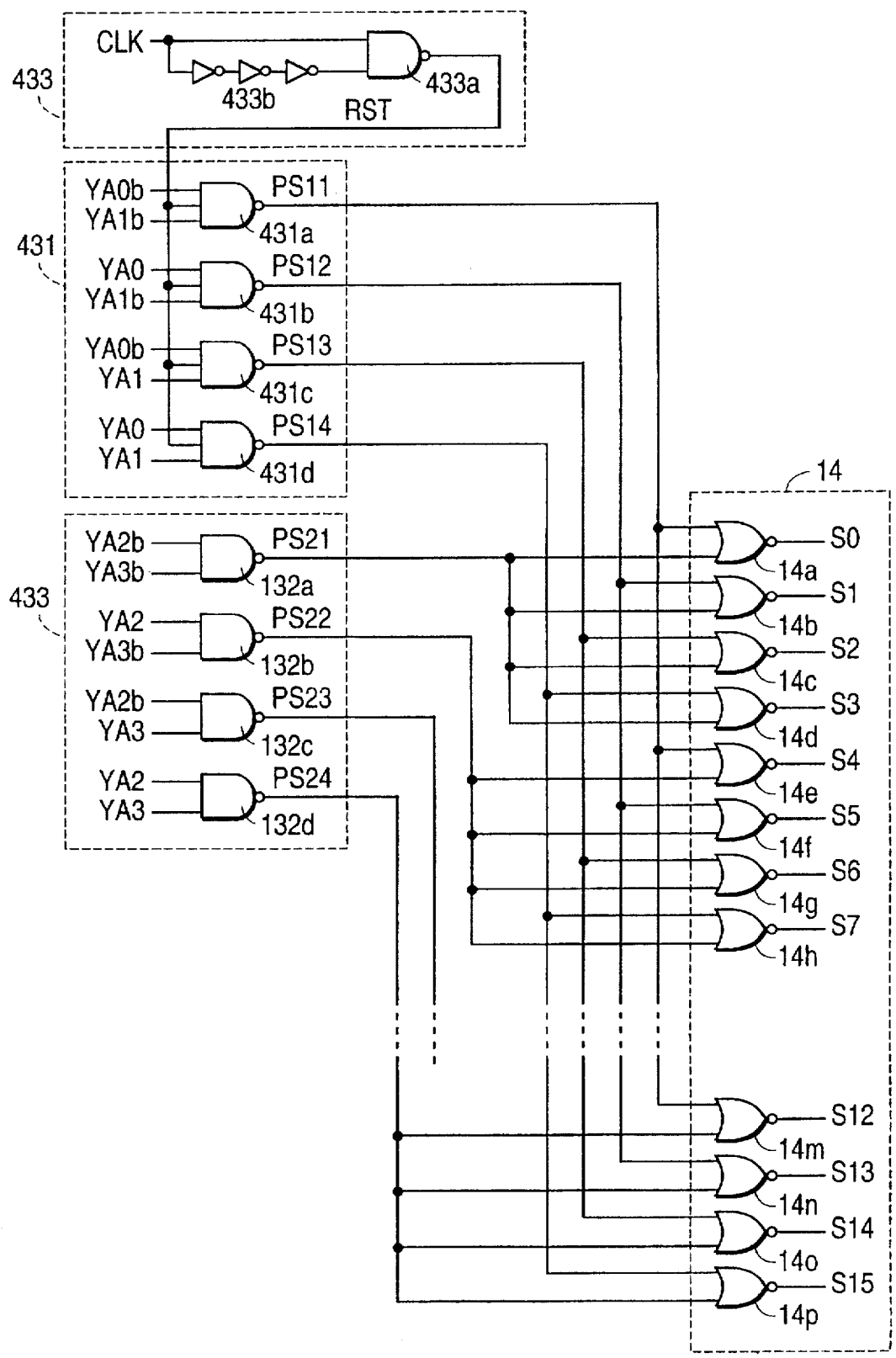
FIG. 5 is a circuit diagram illustrating a Y address decoder according to the second embodiment of the present invention.

FIG. 5 is a circuit diagram showing the Y address predecoders 43, the pulse generator 433 and the Y address decoder 14 illustrated in FIG. 4. The Y address predecoders 43 shown in FIG. 5 will be described by being divided into a first Y address predecoder 431 and a second Y address predecoder 433.

The pulse generator 433 comprises a two-input NAND circuit 433a and a row of three inverters 433b. The external synchronization input signal CLK is inputted to the input of the inverter row 433b. One input of the twoinput NAND circuit 433a is supplied with the external synchronization input signal CLK, whereas the other input thereof is inputted with the output of the inverter row 433b. Thus, the pulse generator circuit 433 outputs a reset signal RST from the output thereof.

The first Y address predecoder 431 comprises four three-input NAND circuits 431a, 431b, 431c and 431d. The three-input NAND circuit 431a has inputs respectively supplied with a negative logic signal YA0b corresponding to an internal Y address, a negative logic signal YA1b corresponding to an internal Y address and the reset signal RST and outputs a predecode signal PS11 therefrom. The three-input NAND circuit 431b has inputs respectively supplied with a positive logic signal YA0 corresponding to an internal Y address, the negative logic signal YA1b and the reset signal RST and outputs a predecode signal PS12 therefrom. The three-input NAND circuit 431c has inputs respectively supplied with the negative logic signal YA0b, a positive logic signal YA1 corresponding to an internal Y address and the reset signal RST and outputs a predecode signal PS13 therefrom. The three-input NAND circuit 431d has inputs respectively supplied with the positive logic signal YA0, the positive logic signal YA1 and the reset signal RST and outputs a predecode signal PS14 therefrom.

The second Y address predecoder circuit 433 comprises four two-input NAND circuits 132a, 132b, 132c and 132d. The two-input NAND circuit 132a has inputs respectively supplied with a negative logic signal YA2b corresponding to an internal Y address and a negative logic signal YA3b corresponding to an internal Y address and outputs a predecode signal PS21 therefrom. The two-input NAND circuit 132b has inputs respectively supplied with a positive logic signal YA2 corresponding to an internal Y address, the negative logic signal YA3b and outputs a predecode signal PS22 therefrom. The two-input NAND circuit 132c has inputs respectively supplied with the negative logic signal YA2b for the internal Y address and a positive logic signal YA3 and outputs a predecode signal PS23 therefrom. The two-input NAND circuit 132d has inputs respectively supplied with the positive logic signal YA2 and the positive logic signal YA3 and outputs a predecode signal PS24 therefrom.

The Y address decoder 14 comprises a plurality of two-input NOR circuits 14a through 14p. The predecode signal PS11 and the predecode signal PS21 are inputted to their corresponding inputs of the two-input NOR circuit 14a so that a decode signal S0 is outputted from the two-input NOR circuit 14a. The predecode signal PS12 and the predecode signal PS21 are inputted to their corresponding inputs of the two-input NOR circuit 14b so that a decode signal S1 is outputted from the two-input NOR circuit 14b. The predecode signal PS13 and the predecode signal PS21 are inputted to their corresponding inputs of the two-input NOR circuit 14c so that a decode signal S2 is outputted from the two-input NOR circuit 14c. The predecode signal PS14 and the predecode signal PS21 are inputted to their corresponding inputs of the two-input NOR circuit 14d so that a decode signal S3 is outputted from the two-input NOR circuit 14d. Similarly to the above, the predecode signals PS11, PS12, PS13 and PS14 are subsequently inputted to their corresponding inputs of the two-input NOR circuits 14e through 14p and the predecode signals PS22, PS23 and PS24 are subsequently inputted thereto every four circuits so that decode signals S4 through S15 are outputted from their corresponding two-input NOR circuits 14e through 14p.

Figure 6:
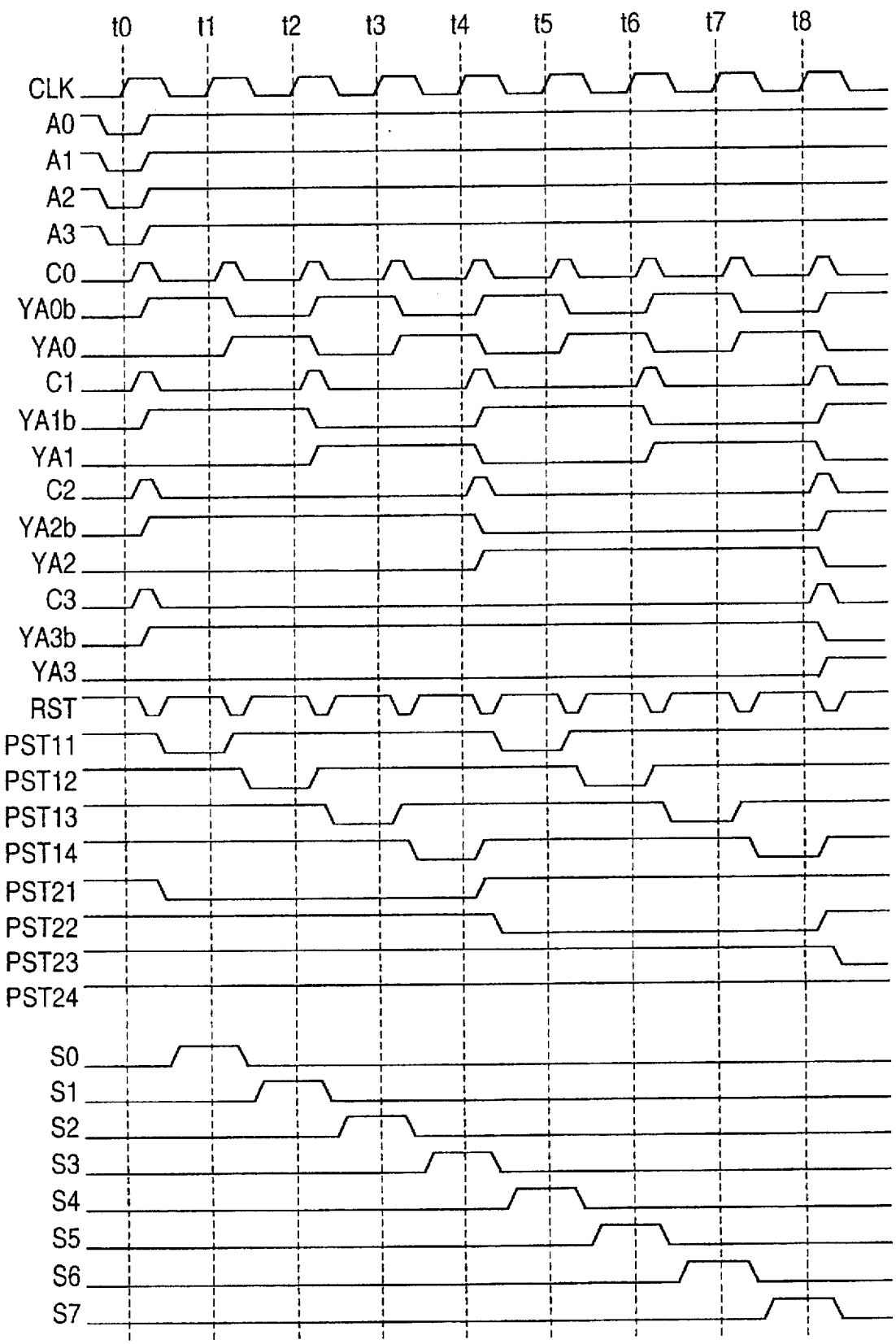
FIG. 6 is a timing chart for describing operating waveforms employed in the second embodiment.

FIG. 6 is a timing chart for describing operating waveforms employed in the synchronous DRAM according to the second embodiment.

Now consider that in advance, respective internal address signals and address count signals have been set to a ground potential (hereinafter called "low level"), respective predecode signals and a reset signal have been set to a source potential (hereinafter called "high level"), and respective decode signals have been set to a low level. A description will be made below of an example in which low-level external input addresses are input at a time t0.

At the time t0, the internal Y address signals are activated and the address count signals C0, C1, C2 and C3 corresponding to pulse signals each having an increment function are activated. The internal Y addresses YA0b, YA1b, YA2b and YA3b change from the low to high levels according to the address count signals C0, C1, C2 and C3. When the reset signal RST corresponding to a pulse signal, which is controlled based on the external synchronization input signal CLK, now changes from the high to low levels, the predecode signal PS11 remains at the high level during that low-level period. Thereafter, when the reset signal RST changes from the low to high levels, the predecode signal PS11 makes a high-level to low-level transition. As a result, the decode signal S0 changes from the low to high levels.

When the address count signal C0 is activated at a time t1, the internal Y address YA0b changes from the high to low levels and the internal Y address YA0 makes a low-level to high-level transition. When the reset signal RST now reaches the low level from the high level, the predecode signal PS11 changes from the low to high levels and hence the decode signal S0 changes from the high to low levels. Thereafter, when the reset signal RST changes from the low to high levels, the predecode signal PS12 makes a high-level to low-level transition. As a result, the decode signal Si changes from the low to high levels.

When the address count signals C0 and C1 are activated at a time t2, the internal Y addresses YA0, YA1 b change from the high to low levels and the internal Y addresses YA0b and YA1 change from the low to high levels. When the reset signal RST makes a high-level to low-level transition, the predecode signal PS12 changes from the low to high levels and hence the decode signal S1 changes from the high to low levels. When the reset signal RST reaches the high level from the low level, the predecode signal PS13 makes a high-level to low-level transition. As a result, the decode signal S2 changes from the low to high levels.

When the address count signal C0 is activated at a time t3, the internal Y address YA0b changes from the high to low levels and the internal Y address YA0 changes from the low to high levels. If the reset signal RST changes from the high to low levels, then the predecode signal PS13 makes a low-level to high-level transition and the decode signal S2 makes a high level to low-level transition. When the reset signal RST changes from the low to high levels, the predecode signal PS14 makes a high-level to lowlevel transition. As a result, the decode signal S3 changes from the low to high levels.

When the address count signals C0, C1 and C2 are activated at a time t4, each of the internal Y addresses YA0, YA1 and YA2b changes from the high to low levels and each of the internal Y addresses YA0b, YA1 b and YA2 makes a low-level to high-level transition. Thus, the predecode signal PS21 changes from the low to high levels and the predecode signal PS22 makes a high-level to low-level transition. When the reset signal RST now changes from the high to low levels, the predecode signal PS14 makes a low-level to high-level transition and the decode signal S3 changes from the high to low levels. Further, when the reset signal RST reaches the high level from the low level, the predecode signal PS11 changes from the high to low levels. As a result, the decode signal S4 changes from the low to high levels.

The same operations as described above are subsequently repeated. As a result, continuously produced decode signals each synchronized with the external synchronization input signal CLK and having a non-select period are selected. Although not shown in FIG. 6, the corresponding NMOS transistor 15 shown in FIG. 5 is thereafter turned ON in response to each selected decode signal to provide electrical connections between the bit line pair BL/BLb and the data buses DB/DBb, whereby a write or read operation is performed.

According to the second embodiment, as has been described above, an advantageous effect can be brought about in that decode signals can be prevented from being multi-selected. A further advantageous effect can be brought about in that since only the first Y address predecoder is used as the circuit for inputting therein the reset signal generated based on the external clock signal, the area of patterns and current consumption can be reduced. Namely, since the predecoder using the three-input NAND circuits is provided only as a single and the other predecoders utilize the two-input NAND circuits, the area of patterns can be reduced. The predecode signals repeatedly change from the high to low levels or vice versa every clock cycles in the first embodiment. However, the predecode signals repeatedly change from the high to low levels or vice versa every four clock cycles in the second embodiment. Therefore, it is possible to reduce current consumption.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A decoder circuit comprising:
    a pulse generator receiving an external clock signal and outputting a reset signal in response to the external clock signal;
    a plurality of address counters receiving the external clock signal and outputting a plurality of address count signals;
    a plurality of address buffers coupled to said address counters respectively, each of said address buffers receiving an external address signal and the address count signal and outputting an internal address signal;
    a plurality of address predecoders coupled to said pulse generator and said address buffers, each of said address predecoders decoding the internal address signals to output a predecode signal in response to the reset signal; and
    an address decoder coupled to said address predecoders, said address decoder decoding the predecode signals to output a plurality of decode signals.

2. A decoder circuit according to claim 1, wherein said pulse generator has a series connected inverters receiving the external clock signal and outputting a delayed external clock signal, and a gate circuit having a first input terminal receiving the external clock signal, a second input terminal receiving the delayed clock signal and an output terminal outputting the reset signal.

3. A decoder circuit according to claim 2, wherein the gate circuit is a NAND circuit.

4. A decoder circuit according to claim 1, wherein each of said address predecoder has a plurality of gate circuits each of which has a first input terminal receiving one of the internal address signals, a second input terminal receiving another one of the internal address signals, a third input terminal receiving the reset signal and an output terminal outputting the predecode signal.

5. A decoder circuit according to claim 4, wherein the gate circuits are NAND circuits.

6. A decoder circuit according to claim 1, wherein said address decoder has a plurality of gate circuits each of which has a first input terminal receiving one of the predecode signals, a second input terminal receiving another one of the predecode signals and an output terminal outputting the decode signal.

7. A decoder circuit according to claim 6, wherein the gate circuits are NOR circuits.

8. A decoder circuit comprising:
- a pulse generator receiving an external clock signal and outputting a reset signal in response to the external clock signal;
- a plurality of address counters receiving the external clock signal and outputting a plurality of address count signals;
- a plurality of address buffers coupled to said address counters respectively, each of said address buffers receiving an external address signal and the address count signal and outputting an internal address signal;
- a first address predecoder coupled to said pulse generator and said address buffers for decoding the internal address signals to output a first predecode signal in response to the reset signal;
- a second address predecoder coupled to said address buffers for decoding the internal address signals to output a second predecode signal; and
- an address decoder coupled to said first and second address predecoders, said address decoder decoding the first and second predecode signals to output a plurality of decode signals.

9. A decoder circuit according to claim 8, wherein said pulse generator has a series connected inverters receiving the external clock signal and outputting a delayed clock signal, and a gate circuit having a first input terminal receiving the external clock signal, a second input terminal receiving the delayed external clock signal and an output terminal outputting the reset signal.

10. A decoder circuit according to claim 9, wherein the gate circuit is a NAND circuit.

11. A decoder circuit according to claim 8, wherein said first address predecoder has a plurality of gate circuits each of which has a first input terminal receiving one of the internal address signals, a second input terminal receiving another one of the internal address signals, a third input terminal receiving the reset signal and an output terminal outputting the first predecode signal.

12. A decoder circuit according to claim 11, wherein the gate circuit is a NAND circuit.

13. A decoder circuit according to claim 8, wherein said second address predecoder has a plurality of gate circuits each of which has a first input terminal receiving one of the internal address signals, a second input terminal receiving another one of the internal address signals and an output terminal outputting the second predecode signal.

14. A decoder circuit according to claim 13, wherein the gate circuit is a NAND circuit.

15. A decoder circuit according to claim 8, wherein said address decoder has a plurality of gate circuits each of which has a first input terminal receiving the first predecode signal, a second input terminal receiving the second predecode signal and an output terminal outputting the decode signal.

16. A decoder circuit according to claim 15, wherein the gate circuits are NOR circuits.

17. A synchronous memory device, comprising
- a memory cell array having a plurality of memory cells;
- a plurality of bit lines each of which is coupled to the memory cells;
- a data bus transferring data;
- a plurality of switches coupled between said bit lines and said data bus, each of said switches being controlled by a decode signal;
- a pulse generator receiving an external clock signal and outputting a reset signal in response to the external clock signal;
- a plurality of address counters receiving the external clock signal and outputting a plurality of address count signals;
- a plurality of address buffers coupled to said address counters respectively, each of said address buffers receiving an external address signal and the address count signal and outputting an internal address signal;
- a plurality of address predecoders coupled to said pulse generator and said address buffers, each of said address predecoders decoding the internal address signals to output a predecode signal in response to the reset signal; and
- an address decoder coupled to said address) predecoders and said switches, said address decoder decoding the predecode signals to output the decode signals.

18. A synchronous memory device according to claim 17, wherein said pulse generator has a series connected inverters receiving the external clock signal and outputting a delayed external clock signal, and a gate circuit having a first input terminal receiving the external clock signal, a second input terminal receiving the delayed clock signal and an output terminal outputting the reset signal.

19. A synchronous memory device according to claim 18, wherein the gate circuit is a NAND circuit.

20. A synchronous memory device according to claim 17, wherein each of said address predecoder has a plurality of gate circuits each of which has a first input terminal receiving one of the internal address signals, a second input terminal receiving another one of the internal address signals, a third input terminal receiving the reset signal and an output terminal outputting the predecode signal.

21. A synchronous memory device according to claim 20, wherein the gate circuits are NAND circuits.

22. A synchronous memory device according to claim 17, wherein said address decoder has a plurality of gate circuits each of which has a first input terminal receiving one of the predecode signals, a second input terminal receiving another one of the predecode signals and an output terminal outputting the decode signal.

23. A synchronous memory device according to claim 22, wherein the gate circuits are NOR circuits.

24. A synchronous memory device comprising:
- a memory cell array having a plurality of memory cells;
- a plurality of bit lines each of which is coupled to the memory cells;
- a data bus transferring data;
- a plurality of switches coupled between said bit lines and said data bus, each of said switches being controlled by a decode signal;

a pulse generator receiving an external clock signal and outputting a reset signal in response to the external clock signal;

a plurality of address counters receiving the external clock signal and outputting a plurality of address count signals;

a plurality of address buffers coupled to said address counters respectively, each of said address buffers receiving an external address signal and the address count signal and outputting an internal address signal;

a first address predecoder coupled to said pulse generator and said address buffers for decoding the internal address signals to output a first predecode signal in response to the reset signal;

a second address predecoder coupled to said address buffers for decoding the internal address signals to output a second predecode signal; and an address decoder coupled to said first and second address predecoders and said switches, said address decoder decoding the first and second predecode signals to output the decode signals.

25. A synchronous memory device according to claim 24, wherein said pulse generator has a series connected inverters receiving the external clock signal and outputting a delayed clock signal, and a gate circuit having a first input terminal receiving the external clock signal, a second input terminal receiving the delayed external clock signal and an output terminal outputting the reset signal.

26. A synchronous memory device according to claim 25, wherein the gate circuit is a NAND circuit.

27. A synchronous memory device according to claim 24, wherein said first address predecoder has a plurality of gate circuits each of which has a first input terminal receiving one of the internal address signals, a second input terminal receiving another one of the internal address signals, a third input terminal receiving the reset signal and an output terminal outputting the first predecode signal.

28. A synchronous memory device according to claim 27, wherein the gate circuit is a NAND circuit.

29. A synchronous memory device according to claim 24, wherein said second address predecoder has a plurality of gate circuits each of which has a first input terminal receiving one of the internal address signals, a second input terminal receiving another one of the internal address signals and an output terminal outputting the second predecode signal.

30. A synchronous memory device according to claim 29, wherein the gate circuit is a NAND circuit.

31. A synchronous memory device according to claim 24, wherein said address decoder has a plurality of gate circuits each of which has a first input terminal receiving the first predecode signal, a second input terminal receiving the second predecode signal and an output terminal outputting the decode signal.

32. A synchronous memory device according to claim 31, wherein the gate circuits are NOR circuits.

* * * * *